(12) United States Patent
Rowley

(10) Patent No.: US 11,513,734 B2
(45) Date of Patent: *Nov. 29, 2022

(54) HARDWARE-BASED POWER MANAGEMENT INTEGRATED CIRCUIT REGISTER FILE WRITE PROTECTION

(71) Applicant: Micron Technology, Inc., Boise, ID (US)

(72) Inventor: Matthew David Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

This patent is subject to a terminal disclaimer.

(21) Appl. No.: 17/066,305

(22) Filed: Oct. 8, 2020

(65) Prior Publication Data

US 2021/0026569 A1 Jan. 28, 2021

Related U.S. Application Data

(63) Continuation of application No. 15/919,026, filed on Mar. 12, 2018, now Pat. No. 10,802,754.

(51) Int. Cl.
*G06F 12/00* (2006.01)
*G06F 13/00* (2006.01)
*G06F 3/06* (2006.01)
*G11C 5/14* (2006.01)

(52) U.S. Cl.
CPC ......... *G06F 3/0659* (2013.01); *G06F 3/0622* (2013.01); *G06F 3/0679* (2013.01); *G11C 5/147* (2013.01)

(58) Field of Classification Search
CPC .... G06F 3/0659; G06F 3/0622; G06F 3/0679; G11C 5/147
USPC ......................................................... 711/154
See application file for complete search history.

(56) References Cited

U.S. PATENT DOCUMENTS

| | | | | |
|---|---|---|---|---|
| 4,648,050 A | * | 3/1987 | Yamagami | G09G 5/022 345/537 |
| 5,329,630 A | * | 7/1994 | Baldwin | G06F 9/30167 711/149 |
| 5,428,754 A | * | 6/1995 | Baldwin | G06F 1/08 712/220 |
| 5,594,868 A | * | 1/1997 | Nakagoshi | G06F 15/17368 370/230 |
| 5,659,690 A | * | 8/1997 | Stuber | G06F 13/385 710/307 |

(Continued)

*Primary Examiner* — Sheng Jen Tsai
(74) *Attorney, Agent, or Firm* — Greenberg Traurig

(57) ABSTRACT

Disclosed are devices and methods for protecting the register file of a power management integrated circuit (PMIC). In one embodiment, a device is disclosed comprising: a register file comprising a plurality of a registers, at least one register in the register file containing a write register bit (WRB); and an interface configured to receive messages from a host application, the messages including a WRB enablement signal, wherein the device is configured to enable writing to the register file in response to receiving the WRB enablement signal over the interface, write data in response to write messages while writing to the register file is enabled, and disable writing to the register file in response to receiving a stop bit over the interface.

20 Claims, 4 Drawing Sheets

(56) References Cited

U.S. PATENT DOCUMENTS

| | | | | |
|---|---|---|---|---|
| 5,826,069 A * | 10/1998 | McCullough | G06F 9/3836 | 712/220 |
| 5,958,024 A * | 9/1999 | Typaldos | G06F 13/385 | 709/221 |
| 6,072,508 A * | 6/2000 | Devic | G06F 9/3879 | 345/522 |
| 6,205,543 B1 * | 3/2001 | Tremblay | G06F 9/30043 | 712/228 |
| 6,339,823 B1 * | 1/2002 | Loper, Jr. | G06F 9/3013 | 711/165 |
| 6,384,634 B1 * | 5/2002 | Brissette | G06F 5/14 | 326/40 |
| 6,453,423 B1 * | 9/2002 | Loison | G06F 1/26 | 713/310 |
| 6,604,190 B1 * | 8/2003 | Tran | G06F 9/383 | 712/204 |
| 6,845,412 B1 * | 1/2005 | Boike | G06F 13/1652 | 710/36 |
| 7,330,924 B1 * | 2/2008 | Kao | H04L 12/56 | 370/248 |
| 7,421,559 B1 * | 9/2008 | Yadav | G11C 7/1075 | 365/230.05 |
| 10,127,968 B2 * | 11/2018 | Edirisooriya | G06F 1/30 | |
| 10,423,218 B1 | 9/2019 | Rowley | | |
| 10,802,754 B2 * | 10/2020 | Rowley | G06F 3/0659 | |
| 2002/0038412 A1 * | 3/2002 | Nizar | G11C 7/20 | 711/170 |
| 2003/0122835 A1 * | 7/2003 | Doyle | G06T 1/60 | 345/537 |
| 2005/0223410 A1 * | 10/2005 | Li | H04N 21/426 | 725/135 |
| 2006/0112257 A1 * | 5/2006 | Undy | G01R 31/31707 | 712/1 |
| 2007/0040657 A1 * | 2/2007 | Fosler | H02M 3/33515 | 340/333 |
| 2007/0110053 A1 * | 5/2007 | Soni | H04L 69/22 | 370/389 |
| 2007/0174590 A1 * | 7/2007 | Augusteijn | G06F 9/3824 | 712/218 |
| 2007/0288778 A1 * | 12/2007 | Zhuang | G06F 1/3203 | 713/320 |
| 2008/0019466 A1 * | 1/2008 | Limberg | H04N 21/4382 | 375/346 |
| 2008/0184017 A1 * | 7/2008 | Stuttard | G06F 9/30094 | 712/234 |
| 2008/0244369 A1 * | 10/2008 | Jiang | G06F 11/1032 | 714/800 |
| 2009/0037694 A1 * | 2/2009 | Luick | G06F 9/30109 | 712/204 |
| 2009/0240920 A1 * | 9/2009 | Muff | G06F 9/30043 | 712/218 |
| 2010/0274991 A1 * | 10/2010 | Duan | G06F 9/30181 | 712/41 |
| 2011/0022826 A1 * | 1/2011 | More | G06F 1/26 | 713/1 |
| 2011/0035643 A1 * | 2/2011 | Bybell | G06F 11/1658 | 714/758 |
| 2011/0231675 A1 * | 9/2011 | Lambert | G06F 1/3203 | 713/300 |
| 2012/0008450 A1 * | 1/2012 | Turner | G11C 7/1006 | 365/230.03 |
| 2012/0324174 A1 * | 12/2012 | Damodaran | G06F 9/30141 | 711/154 |
| 2012/0324175 A1 * | 12/2012 | Damodaran | G06F 9/30141 | 711/154 |
| 2014/0189304 A1 * | 7/2014 | Sun | G06F 9/30112 | 712/42 |
| 2014/0189318 A1 * | 7/2014 | Sun | G06F 9/30141 | 712/220 |
| 2014/0229644 A1 * | 8/2014 | Thanigasalam | G06F 13/1673 | 710/110 |
| 2015/0378741 A1 * | 12/2015 | Lukyanov | G06F 9/30014 | 712/226 |
| 2016/0011005 A1 * | 1/2016 | Wang | G06Q 20/145 | 340/870.02 |
| 2018/0121282 A1 * | 5/2018 | Barrilado Gonzalez | G06F 11/10 | |
| 2018/0300845 A1 * | 10/2018 | Lake | G06T 1/60 | |
| 2019/0278362 A1 | 9/2019 | Rowley | | |
| 2019/0278364 A1 | 9/2019 | Rowley | | |
| 2019/0278516 A1 | 9/2019 | Rowley | | |

* cited by examiner

HARDWARE-BASED POWER MANAGEMENT INTEGRATED CIRCUIT REGISTER FILE WRITE PROTECTION

RELATED APPLICATIONS

The present application is a continuation application of U.S. patent application Ser. No. 15/919,026 filed Mar. 12, 2018, issued as U.S. Pat. No. 10,802,754 on Oct. 13, 2020, entitled "Hardware-Based Power Management Integrated Circuit Register File Write Protection", the entire disclosure of which application is hereby incorporated herein by reference.

FIELD OF THE TECHNOLOGY

At least some embodiments disclosed herein relate to power management integrated circuit (PMIC) in general and, more particularly but not limited to, hardware-based PMIC register file write protection.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

When a memory system is coupled to a host computer, the host computer may use a standardized logical device interface protocol to address the memory system in a way independent from the specific media implementation of the memory system. For example, Non-Volatile Memory Host Controller Interface Specification (NVMHCI), also known as NVM Express (NVMe), specifies the logical device interface protocol for accessing non-volatile storage devices via a Peripheral Component Interconnect Express (PCI Express or PCIe) bus.

A memory system can include a Power Management Integrated Circuit (PMIC) that can be used to manage the power requirements of the memory system in which the PMIC is configured. The PMIC typically includes electronic power conversion circuitry and/or relevant power control functions.

A PMIC additionally allows for programmable control of the power functionality of the PMIC. For example, a PMIC may be reconfigured to change the power sequence, output voltages, and various other functions of the PMIC. Changes to PMIC devices generally take the form of modifying register values stored in a register file of a PMIC device, whereby other circuits of the PMIC utilize these register values to control operation of the internal PMIC circuitry.

In current PMIC devices, an external microcontroller is used to prevent malicious or unauthorized write to the PMIC device. Specifically, a microcontroller external to the PMIC is configured with firmware that monitors incoming requests to write to the register file and allow or disallow requests based on hard-coded rules.

The use of such external, firmware-based microcontrollers introduces latency in write operations, introduces extraneous complexity in manufacturing, and increases the overall cost of a board incorporating the PMIC. The additional microcontrollers additionally increase the error and attack surface of PMIC devices.

BRIEF DESCRIPTION OF THE DRAWINGS

The embodiments are illustrated by way of example and not limitation in the figures of the accompanying drawings in which like references indicate similar elements.

DETAILED DESCRIPTION

Aspects of the present disclosure are directed to a power management integrated circuit (PMIC) in a memory system. An example of a memory system is a storage system, such as a solid-state drive (SSD). In some embodiments, the memory system is a hybrid memory/storage system. In general, a host system can utilize a memory system that includes one or more memory devices. The memory devices can include media. The media can be non-volatile memory devices, such as, for example, negative-and (NAND). The host system can provide write requests to store data at the memory devices of the memory system and can provide read requests to retrieve data stored at the memory system. A memory system can include a controller that manages the memory devices to perform operations such as reading data, writing data, or erasing data and other such operations. A storage system (also hereinafter referred to as storage device) is used as one example of the memory system hereinafter throughout this document.

Figure 1:
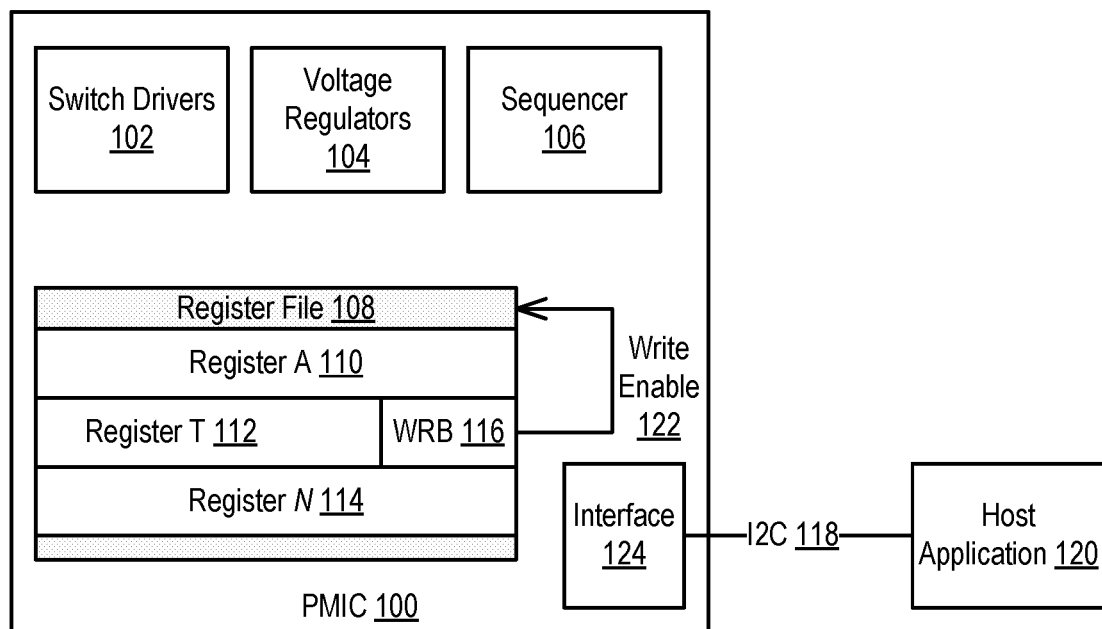
FIG. 1 is a block diagram of a power management integrated circuit according to some embodiments of the disclosure.

FIG. 1 is a block diagram of a power management integrated circuit according to some embodiments of the disclosure.

The PMIC (100) illustrated in FIG. 1 includes switch drivers (102), voltage regulators (104) and sequencer (106) as well as a register file (108). The PMIC (100) is connected to a host application (120) via a bus (118), such as an I2C bus. In the illustrated embodiment, the host application (120) comprises an external computing device that provides read and write commands to the PMIC (100). In the illustrated embodiment, interface (124) is configured to receive and transmit commands over the bus (118) and forward write requests to register file (108).

The PMIC (100) has one or more voltage regulators (104) that convert the external power supply to the PMIC (100) to operating voltages used by various components of the device (or devices) powered by the PMIC (100) (e.g., solid-state storage devices, DRAM, etc.). The PMIC (100) includes a plurality of switch drivers (102) that provide the control signals for the load switches (not illustrated) that selectively enable and disable power to and from the supported devices. The PMIC (100) includes a sequencer (106) that schedules the power related events according to desirable sequences for the operations of the supported devices, including the sequences of the operations of the voltage regulators (102) and the switch drivers (104).

In general, control signals, data and/or commands received from the host application (120) are connected to the PMIC (100) for power management. As illustrated, the bus (118) comprises an I2C bus.

An I2C bus is a multi-master, multi-slave, packet switched, single-ended, serial computer bus used often for intra-board communication between lower-speed devices and higher speed device such as processors and microcontrollers. An I2C bus utilizes two bidirectional open-drain lines (Serial Data Line (SDL) and Serial Clock Line (SCL)) pulled up using resistors. Voltages applied to such resistors may be of varying values (e.g., +5V or +3.3V). In general, I2C buses utilize a 7-bit address space operating at 100 kbit/s standard mode and a 400 kbit/s "Fast" mode, although arbitrary clock frequencies may be utilized.

One or more master nodes and one or more slave nodes are connected via an I2C bus. A master node generates the clock signal on SCL and initiates communication with salve devices. The slave nodes receive the clock signal and respond to communications from the master node.

I2C interfaces are sometimes included in PMIC devices. These interfaces allow for programmable control of the PMIC device. For example, voltage transition slew rates may be programmable via the I2C interface. As another example, output voltage enablement/disablement, pulse skipping mode activation, force contiguous current mode, and other features of the PMIC may be enabled via the I2C interface.

The PMIC (100) additionally includes a register file (108). In one embodiment, the register file (108) stores data controlling the operation of the various internal circuits of the PMIC (100) (e.g., circuits 102-106). In one embodiment, each register (e.g., 110-114) may be of a fixed length (e.g., 16 bits, 32 bits, etc.), although the specific length is not intended to be limited.

In previous systems, a host application (120) is capable of reading and writing to the individual registers (110-114) directly. In other embodiments, the host application (120) would be connected to the PMIC (100) via an intermediary microcontroller that includes firmware that controls read and write access to the register file (108).

In contrast, the system in FIG. 1 provides direct access between the host application (120) and the register file (108) via the bus (118). To enable this functionality without the use of additional circuitry, the register file (108) includes a write register bit (WRB) (116). In one embodiment, the WRB (116) is a single bit located in a predefined register, register T (112). In some embodiments, the WRB (116) may comprise either the first or last bit of register T (112) although the specific register location is not intended to be limiting.

In operation, when the host application (120) writes to the WRB (116), this causes the register file (108) to enable a write mode of operation. In one embodiment, the WRB (116) is tied to a write enable signal (122) that changes the operational mode of the register file (108). Prior to writing, the register file (108) is kept in a read-only mode. Alternatively, the register file (108) may be configured to only accept internal writes (e.g., write commands not received via bus (118)) when in read-only mode (e.g., a protected write mode).

As will be described in the corresponding flow diagrams, a host application (120) may then transmit a write address and data after enabling the WRB (116). The write address may comprise a register (112-116) address. The data may comprise any valid data to control the operation of the PMIC (100). Although only three registers (112-116) are illustrated, the disclosed embodiments are not limited to a specific number of registers.

The PMIC (100) additionally monitors the bus (118) for a stop bit. In some embodiments, this may comprise a STOP instructions issued according to the I2C specification. In alternative embodiments, the stop bit may comprise detecting that the WRB (116) has changed state (e.g., from one to zero). Upon detecting the stop bit, the PMIC (100) forces the register file (108) again into read-only more (or protected write mode). The use of a stop bit prevents an unintended "unlocking" of the register file after the host application (120) finishes writing.

In the illustrated embodiment, the location of WRB (116) is not publicly disclosed, thus enabling secrecy of the write mode enablement procedure. In some embodiments, the valid contents of register T (112) may be verified using a cyclic redundancy check or linear block code. In this manner, the PMIC (100) can ensure that the WRB (116) is not accidentally, or maliciously, set by the host application (120).

In one embodiment, the sequence of setting the WRB (116) and transmitting a write address and data can be repeated as necessary. In some embodiments, the WRB (116) may only be set once and multiple write addresses and data may be transmitted (followed by a stop bit). In alternative embodiments, the WRB (116) must be set before each write address/data and a stop bit must be transmitted after the same write address/data.

Figure 2:
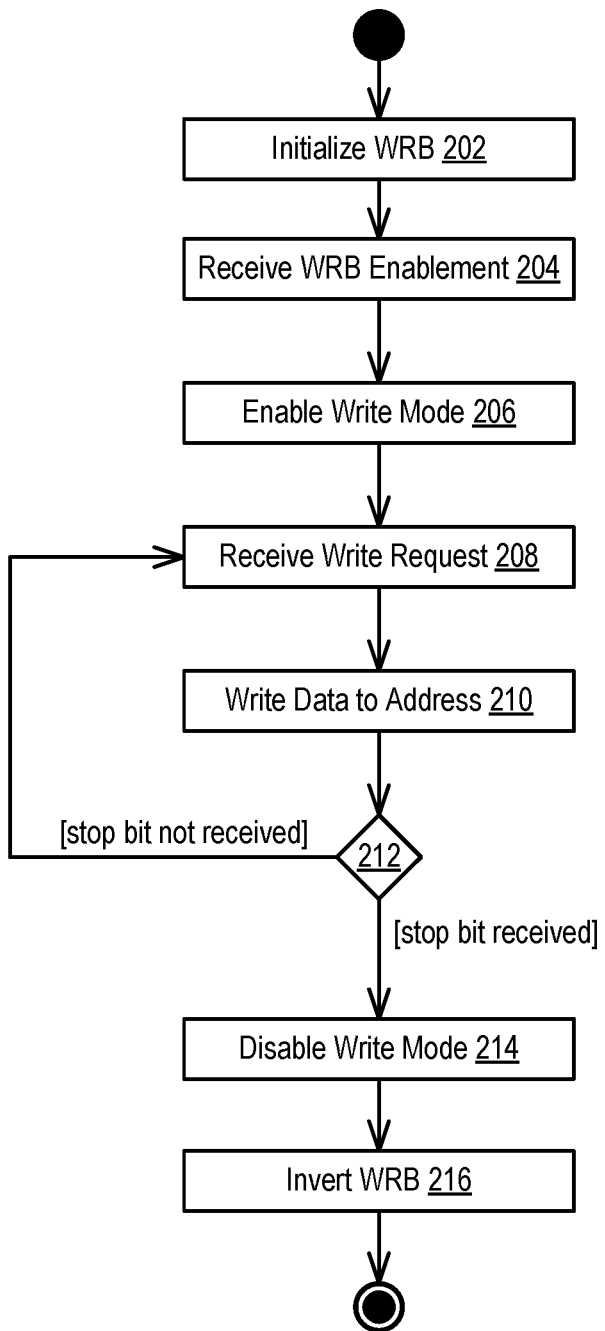
FIG. 2 is a flow diagram illustrating a method for writing to a register file of a power management integrated circuit according to some embodiments of the disclosure.

FIG. 2 is a flow diagram illustrating a method for writing to a register file of a power management integrated circuit according to some embodiments of the disclosure.

At block 202, the method initializes a write register bit (WRB) of a register in a register file. As described above, a PMIC may initialize a specific bit of a register in a register file with a defined value representing that the register file is in a read-only (or protected write) mode. In one embodiment, this comprises setting the WRB to zero. In some embodiments, the register containing the WRB may continue to be used in normal operations.

At block 204, the method receives a WRB enablement signal.

In one embodiment, the WRB enablement signal comprises a message received over a bus (e.g., an I2C bus) indicating that a write message is requested. In some embodiments, the WRB enablement signal specifies the position in a register (e.g., a bit number of a register number). For example, if the WRB is the sixth bit of register eleven, the WRB enablement signal may comprise an identifier 0x050B.

In an alternative embodiment, the write enablement signal may comprise a standard write command. In a simple example, if a register file includes four bit registers, the first bit of the third register comprising the WBR, a write command may be issued as follows: WRITE 0x8, 0x04 (thus writing "1000" to register four, setting the WBR to one). In some embodiments, the contents of the enablement message beyond the WBR are immaterial. Thus values of 0x9 (1001) and other values may be used. In some embodiments, at block 204, the method may receive various write requests and may only allow writing to a specific register (containing the WRB) to prevent unauthorized writes.

At block 206, the method enables a write mode in response to detecting that the WBR was enabled. In one embodiment, enabling a write mode comprises transmitting a signal to the register file indicating the all writes are allowed to the register file. In some embodiments, the bit line of the WBR may be explicitly hardwired to a write enable of the register file. Thus, the enablement is automatically performed when the WBR is raised.

At block 208, the method receives a write request. In one embodiment, a write request comprises a register address and data to be written. In the illustrated embodiment, no limitation is placed on the data included within the write request.

At block 210, the method writes the data in the write request to the register at the address in the write request. As described above, a write request may write any arbitrary data to the register identified in the request.

At block 212, the method determines if a stop bit was received.

In one embodiment, the method may continuously analyze a bus to determine if a STOP command is received from a host application. Alternatively, the method may monitor the bus to determine if a write request is received that manipulates the WRB. Continuing the previous example, a command WRITE 0x0, 0x04 lowers the WRB value and thus is interpreted as a stop command.

If a stop bit is not received, the method may continue to receive and process write requests (208-210). In this embodiment, the method allows for multiple writes between enabling (206) and disabling (214) the write mode of the register file. Alternatively, the method may bypass step 212 and terminate the write mode after each write request.

At block 214, the method disables a write mode of the register file in response to the stop bit.

In one embodiment, after detecting the stop bit, the PMIC may disable a write enable mode of the register file. In some embodiments, the WRB is hardwired to the write enable of the register file. In some embodiments, the WRB may hardwired via a multiplexer enabling other write enable signals from other components. Thus, when a WRB is lowered to zero, the register file is set in a read-only (or write protected) mode automatically.

Figure 3:
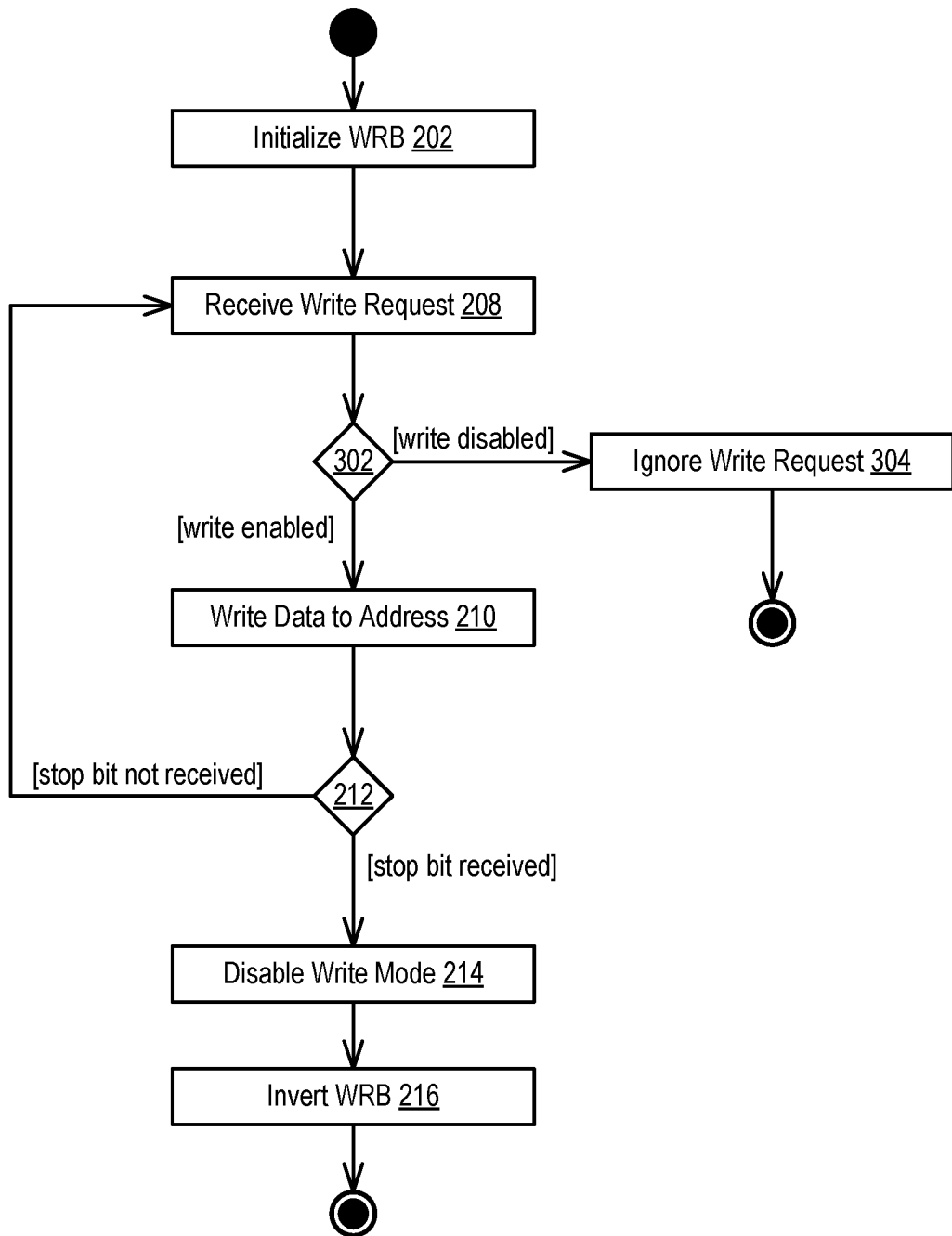
FIG. 3 is a flow diagram illustrating a method for denying write requests to a register file of a power management integrated circuit according to some embodiments of the disclosure.

FIG. 3 is a flow diagram illustrating a method for denying write requests to a register file of a power management integrated circuit according to some embodiments of the disclosure.

Many of the operations in FIG. 3 are identical to those in FIG. 2 e.g., block 202, 208, 210, 212, 214, and 216) and the disclosure of those steps is incorporated herein by reference in its entirety.

As previously discussed, a method initializes a WRB (202) and receives a write request (208).

At block 302, the method determines whether a write mode is enabled for the registry file.

In some embodiments, the operation at block 302 may be performed automatically by the register file. For example, if the WRB is hardwired to the write enable of the register file the method automatically determines that the register file is in read only mode. Alternatively, the method may rely on an additional (small) circuit to read the WBR value and, if one, determine that writing is enabled and, if zero, determine that writing is disabled.

At block 304, the method ignores the write request if writing is disabled.

In some embodiments, the method simply discards the message. In other embodiments, the method may employ a short counter to disable further write requests for a small number of clock cycles. In some embodiments, this counter may be employed to prevent brute force attempts to try all combinations of register values.

If the method determines that writing is enabled, the method writes data to the address in the write request (210) and continues writing until a stop bit is detected (212, 214). In the illustrated embodiment, the receipt of a stop bit in step 212 would result in WBR being set to zero. Thus, future write requests in step 208 would undergo the enablement detection at block 302, preventing piggybacking of write requests.

Figure 4:
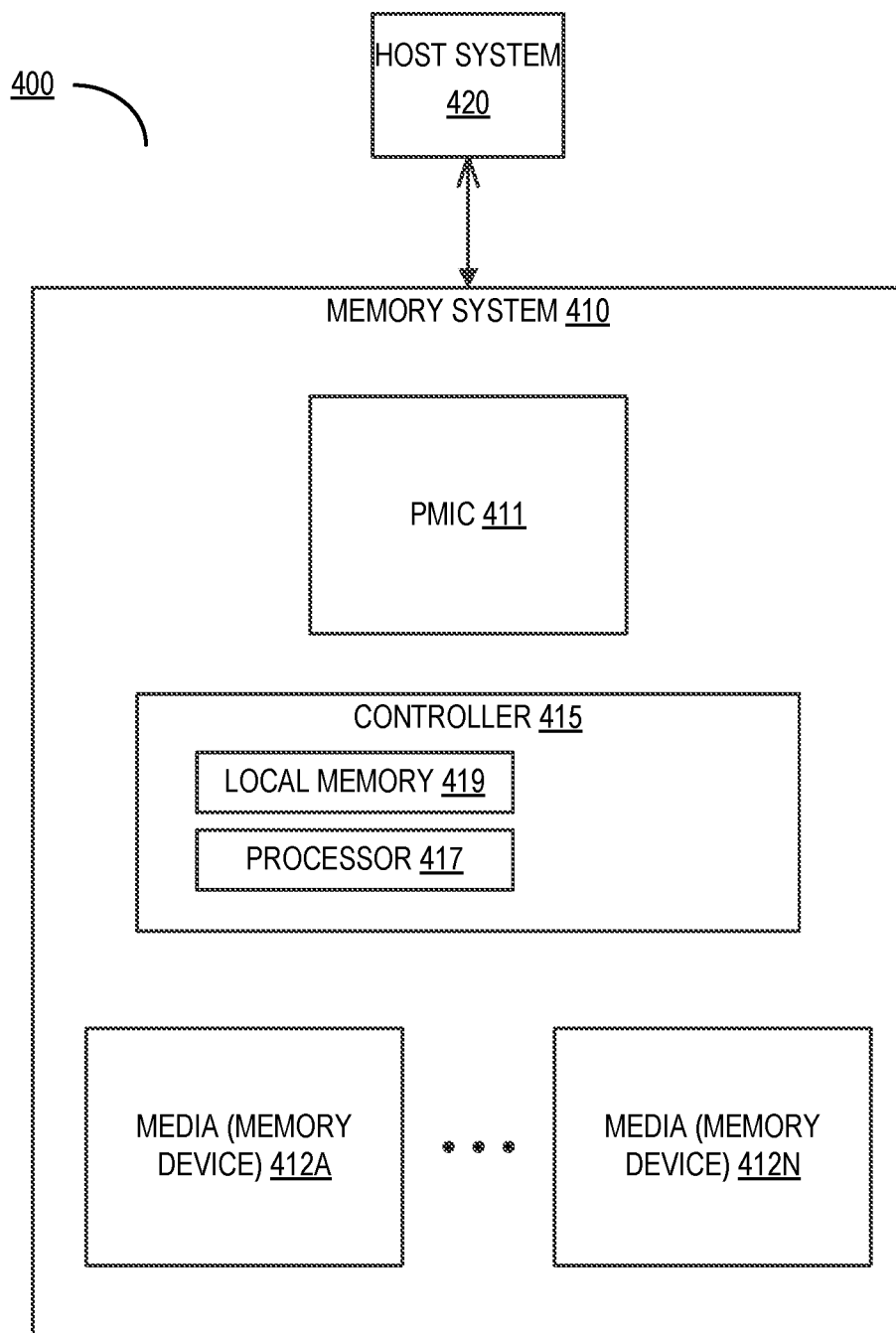
FIG. 4 illustrates an example computing environment that includes a memory system in accordance with some implementations of the present disclosure.

FIG. 4 illustrates an example computing environment 400 that includes a memory system 410 in accordance with some implementations of the present disclosure. The memory system 410 can include media, such as memory devices 412A to 412N. The memory devices 412A to 412N can be volatile memory devices, non-volatile memory devices, or a combination of such. In some embodiments, the memory system is a storage system. An example of a storage system is a SSD. In some embodiments, the memory system 410 is a hybrid memory/storage system. In general, the computing environment 400 can include a host system 420 that uses the memory system 410. In some implementations, the host system 420 can write data to the memory system 410 and read data from the memory system 410.

The host system 420 can be a computing device such as a desktop computer, laptop computer, network server, mobile device, or such computing device that includes a memory and a processing device. The host system 420 can include or be coupled to the memory system 410 so that the host system 420 can read data from or write data to the memory system 410. The host system 420 can be coupled to the memory system 410 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 420 and the memory system 410. The host system 420 can further utilize an NVM Express (NVMe) interface to access the memory devices 412A to 412N when the memory system 410 is coupled with the host system 420 by the PCIe interface. The physical host interface can provide an interface for passing control, address, data, and other signals between the memory system 410 and the host system 420.

The memory devices 412A to 412N can include any combination of the different types of non-volatile memory devices and/or volatile memory devices. An example of non-volatile memory devices includes a negative-and (NAND) type flash memory. Each of the memory devices 412A to 412N can include one or more arrays of memory cells such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store bits of data (e.g., data blocks) used by the host system 420. Although non-volatile memory devices such as NAND type flash memory are described, the memory devices 412A to 412N can be based on any other type of memory such as a volatile memory. In some implementations, the memory devices 412A to 412N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 412A to 412N can be grouped as memory pages or data blocks that can refer to a unit of the memory device used to store data.

The controller 415 can communicate with the memory devices 412A to 412N to perform operations such as reading data, writing data, or erasing data at the memory devices 412A to 412N and other such operations. The controller 415 can include hardware such as one or more integrated circuits and/or discrete components, a buffer memory, or a combination thereof. The controller 415 can be a microcontroller, special purpose logic circuitry (e.g., a field programmable gate array (FPGA), an application specific integrated circuit (ASIC), etc.), or other suitable processor. The controller 415 can include a processor (processing device) 417 configured to execute instructions stored in local memory 419. In the illustrated example, the local memory 419 of the controller 415 includes an embedded memory configured to store instructions for performing various processes, operations, logic flows, and routines that control operation of the memory system 410, including handling communications between the memory system 410 and the host system 420. In some embodiments, the local memory 419 can include memory registers storing, e.g., memory pointers, fetched data, etc. The local memory 419 can also include read-only memory (ROM) for storing micro-code. While the example memory system 410 in FIG. 4 has been illustrated as including the controller 415, in another embodiment of the present disclosure, a memory system 410 may not include a controller 415, and may instead rely upon external control (e.g., provided by an external host, or by a processor or controller separate from the memory system).

In general, the controller 415 can receive commands or operations from the host system 420 and can convert the commands or operations into instructions or appropriate commands to achieve the desired access to the memory devices 412A to 412N. The controller 415 can be responsible for other operations such as wear leveling operations, garbage collection operations, error detection and error-correcting code (ECC) operations, encryption operations, caching operations, and address translations between a logical block address and a physical block address that are associated with the memory devices 412A to 412N. The controller 415 can further include host interface circuitry to communicate with the host system 420 via the physical host interface. The host interface circuitry can convert the commands received from the host system into command instructions to access the memory devices 412A to 412N as well as convert responses associated with the memory devices 412A to 412N into information for the host system 420.

The memory system 410 can also include additional circuitry or components that are not illustrated. In some implementations, the memory system 410 can include a cache or buffer (e.g., DRAM) and address circuitry (e.g., a row decoder and a column decoder) that can receive an address from the controller 415 and decode the address to access the memory devices 412A to 412N.

The memory system 410 can include PMIC 411 (e.g., PMIC 100 in FIG. 1). The memory system 410 can include additional circuitry, such as illustrated in FIG. 1.

In this description, various functions and operations may be described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor or microcontroller, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processors in a computer, cause the computer to perform operations necessary to execute elements involving the various aspects.

A tangible, non-transitory computer storage medium can be used to store software and data which, when executed by a data processing system, causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine-readable medium in their entirety at a particular instance of time.

Examples of computer-readable storage media include, but are not limited to, recordable and non-recordable type media such as volatile and non-volatile memory devices, read only memory (ROM), random access memory (RAM), flash memory devices, floppy and other removable disks, magnetic disk storage media, and optical storage media (e.g., Compact Disk Read-Only Memory (CD ROM), Digital Versatile Disks (DVDs), etc.), among others. The instructions may be embodied in a transitory medium, such as electrical, optical, acoustical or other forms of propagated signals, such as carrier waves, infrared signals, digital signals, etc. A transitory medium is typically used to transmit instructions, but not viewed as capable of storing the instructions.

In various embodiments, hardwired circuitry may be used in combination with software instructions to implement the techniques. Thus, the techniques are neither limited to any specific combination of hardware circuitry and software, nor to any particular source for the instructions executed by the data processing system.

Although some of the drawings illustrate a number of operations in a particular order, operations that are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A device comprising:
    a register file comprising a plurality of registers, at least one register in the register file containing a pre-configured bit and a plurality of remaining bits storing data, the pre-configured bit hardwired to a control input of the register file; and
    an interface configured to receive messages, the messages including an enablement signal located at a position of the pre-configured bit, wherein the device is configured to change the operational mode of the register file in response to receiving the enablement signal over the interface.

2. The device of claim 1, wherein changing the operational mode of the register file comprises enabling writing to the register file in response to receiving the enablement signal over the interface, writing data in response to write messages while writing to the register file is enabled, and disabling writing to the register file in response to receiving a stop bit over the interface.

3. The device of claim 2, wherein the register file is configured to process an internal write operation after disabling writing to the register file, the internal write operation comprising a write operation not received over an external bus.

4. The device of claim 2, wherein the interface is further configured to ignore write operations if writing is disabled.

5. The device of claim 4, wherein ignoring a write operation in the write operations comprises discarding the write operation.

6. The device of claim 4, wherein ignoring a write operation comprises continuously incrementing a counter and ignoring write operations until the counter reaches a preset value.

7. The device of claim 1, wherein the interface is configured to perform a cyclic redundancy check on the at least one register prior to writing to the pre-configured bit.

8. The device of claim 1, wherein the operational mode is changed before each write operation received by the interface.

9. The device of claim 1, the register file further comprising a write enable and the pre-configured bit being hardwired to the write enable.

10. The device of claim 1, the pre-configured bit comprising a first or last bit of a designated register.

11. A method comprising:
    receiving an enablement signal associated with a position of a pre-configured bit of at least one register of a register file, the at least one register having a plurality of remaining bits storing data; and
    changing the operational mode of a register file in response to receiving the enablement signal over the interface.

12. The method of claim 11, wherein changing the operational mode of the register file comprises:
    enabling a write mode of the register file;
    receiving a write request;
    writing data included in the write request to a register in the register file;
    receiving a stop bit; and
    disabling the write mode of the register file.

13. The method of claim 12, further comprising processing an internal write operation after disabling writing to the register file, the internal write operation comprising a write operation not received over an external bus.

14. The method of claim 12, further comprising ignoring write operations if writing is disabled.

15. The method of claim 14, wherein ignoring a write operation in the write operations comprises discarding the write operation.

16. The method of claim 14, wherein ignoring a write operation comprises continuously incrementing a counter and ignoring write operations until the counter reaches a preset value.

17. The method of claim 11, further comprising performing a cyclic redundancy check on the at least one register prior to writing to the pre-configured bit.

18. The method of claim 11, further comprising changing the operational mode before receiving a write operation.

19. The method of claim 11, wherein receiving the enablement signal comprises receiving an address of the designated register and a value, the value comprising a value setting the enablement signal.

20. A non-transitory computer-readable storage medium for tangibly storing computer program instructions capable of being executed by a computer processor, the computer program instructions defining the steps of:
    receiving an enablement signal associated with a position of a pre-configured bit of at least one register of a register file, the at least one register having a plurality of remaining bits storing data; and changing the operational mode of a register file in response to receiving the enablement signal over the interface.

\* \* \* \* \*